United States Patent [19]

Freedman et al.

[11] Patent Number: 5,274,210

[45] Date of Patent: Dec. 28, 1993

[54] LASER BONDING HIGHLY REFLECTIVE SURFACES

[75] Inventors: Gary M. Freedman, Stow; Maurice P. Brodeur, Concord, both of Mass.; Peter J. Elmgren, Hampstead, N.H.

[73] Assignee: Digital Equipment Corporation, Maynard, Mass.

[21] Appl. No.: 25,197

[22] Filed: Mar. 2, 1993

[51] Int. Cl.$^5$ .............................................. B23K 26/00
[52] U.S. Cl. ......................... 219/121.63; 219/121.64; 219/85.12
[58] Field of Search ................ 219/121.63, 121.64, 219/121.12, 121.13, 85.12, 85.13

[56] References Cited

U.S. PATENT DOCUMENTS

| | | | |
|---|---|---|---|
| 4,023,005 | 5/1977 | Bolin | 219/121 |
| 4,314,260 | 2/1982 | Drexler | 346/76 |
| 4,697,061 | 9/1987 | Spater et al. | 219/121 |
| 4,733,039 | 3/1988 | Schnable et al. | 219/121 |
| 4,822,718 | 4/1989 | latham et al. | 430/271 |
| 4,840,304 | 6/1989 | Sato et al. | 228/214 |
| 4,855,102 | 8/1989 | Okada et al. | 419/8 |
| 4,978,835 | 12/1990 | Luijtjes et al. | 219/121 |
| 5,008,512 | 4/1991 | Spletter et al. | 219/121 |
| 5,021,630 | 6/1991 | Benko et al. | 219/121 |
| 5,049,718 | 9/1991 | Spletter et al. | 219/121 |

OTHER PUBLICATIONS

Alexander A. Bosna and Jeffrey D. Emmel, Westinghouse Electric Corporation, pp. 239-246, 'Use of Lasers in High Speed Termination of Flexible Printed Wiring'.

*Primary Examiner*—C. L. Albritton
*Attorney, Agent, or Firm*—William P. Skladony; Ronald C. Hudgens; Albert P. Cefalo

[57] ABSTRACT

This disclosure relates to laser bonding electrical components having conductive elements which are naturally reflective of the laser beam wavelength. Component leads or pads which are made of copper or have a gold coating, for example, will reflect the wavelength of an Nd:YAG laser, making it difficult to form physical and electrical bonds using the laser bonding technique. In preferred embodiments, the conductive elements are coated with a non-flux, non-metallic, coating material which is less reflective of the laser energy than the conductive elements, making it possible to efficiently use a laser to accomplish bonding.

20 Claims, 3 Drawing Sheets

LASER BONDING HIGHLY REFLECTIVE SURFACES

FIELD OF THE INVENTION

This invention relates to laser bonding electrical components having conductive elements, which are reflective of the wavelength of the laser beam, by coating the reflective surfaces of the conductive elements with a material which is absorptive of the beam energy.

BACKGROUND OF THE INVENTION

Lasers are used as a means for bonding electrical components, such as leaded integrated circuit chips, to printed circuit boards. The laser beam is typically directed at the juncture of a component lead and a contact pad for the purpose of forming a welded, soldered, or brazed joint. In many such applications, the portion of the conductive element, such as the lead, which is impinged by the laser beam has a surface which is absorptive of the laser beam energy, causing a metallic reflow which quickly cools to form the joint.

On the other hand, in other applications it may be necessary to bond components with conductive elements which are not necessarily absorptive of the laser beam energy. For example, certain component leads or contact pads may be made out of materials such as copper, or copper or alloy 42 plated with gold. Such materials may be highly reflective of the beam of commonly used industrial lasers, which thereby makes it difficult to form a reliable physical and electrical contact between the lead and pad. Although it may be possible to cause such highly reflective surfaces to bond by concentrating the laser beam on the reflective surface for a relatively long period of time, this has a degrading effect on manufacturing efficiency and may damage the board by burning it.

One approach taken to address the problems of laser soldering a reflective surface is shown in U.S. Pat. No. 4,733,039, issued to Schnable et al, on Mar. 22, 1988. The Schnable reference discusses the combination of a light absorptive additive with a solder flux composition to improve soldering efficiency.

Solder flux, however, is typically a liquid composition which may continue to flow after it is applied. Consequently it may run in between adjoining conductive elements and onto other areas of the printed circuit board. Thus, if a laser beam is used to sweep around a component, and the light absorptive flux has spread to the areas adjoining the component, it is possible that the printed circuit board may be burned by the laser, resulting in a carbonized trace which may form an unintended electrical connection between adjoining contact pads. Additionally, if a flux containing a particulate or resulting in a particulate were to get in between the surfaces of the two elements being bonded, this could interfere with bonding or weaken the solder joint.

Another approach to the problem of bonding highly reflective surfaces is shown by U.S. Pat. No. 5,008,512, issued to Spletter et al on Apr. 16, 1991. The Spletter method for bonding two highly reflective electrical members is to coat a first electrical member with material that is absorptive of the laser energy, has a lower melting point than either the first or second electrical member, and has a low solubility in the solid alloy of the electrical members. An example of such a coating is the application of a tin coating on copper. Such an approach, however, involves the deposition of the metallic coating onto the conductive elements of the components. Common deposition techniques, such as plating and evaporative methods, tend to be costly.

What is needed therefore is a method of coating the reflective surfaces of the conductive elements of the component with a material that is absorptive of the laser beam energy. Additionally, it is desirable to have a coating material that is stable such that the coating material does not inadvertently run onto other surfaces where it may impair the reliability of the bonding process. Preferably, it should only be applied to the surface of the conductive element that is impinged by the laser. And finally, the process should be inexpensive to implement.

SUMMARY OF THE INVENTION

This invention relates to an apparatus which has a body and an electrically conductive element, which is reflective of the beam of a laser. Coated on the conductive element is a non-flux, non-metallic, coating material, which is less reflective than the conductive element. When the coated surface of the conductive element is irradiated with a laser beam, the coating material improves the absorption of the beam energy.

The invention also relates to a method of laser bonding through which an electrically conductive element, which has a certain percentage of reflectivity of a laser beam, is coated with a non-flux, non-metallic, coating material. The coating material has a percentage of reflectivity which is less than the reflectivity of the conductive element. The method further includes irradiating the coated surface with the laser beam.

Both the apparatus and the method can be used in connection with bonding the conductive element, attached to the body, to a second conductive element. The coating material can be applied so that it does not run onto other surfaces, a condition which could cause unintended electrical connections in the area surrounding the conductive element. And, the coating material can be applied on only the surface of the conductive element that is to be irradiated by the laser, so that the particulates in the coating material do not inhibit bond formation between the conductive element attached to the body and a second conductive element. The coating material and the process of applying it are also inexpensive.

Other objects, features, and advantages of the invention will be further appreciated and better understood upon consideration of the following detailed description of the preferred embodiment, presented in conjunction with the accompanying drawings.

DETAILED DESCRIPTION OF THE PREFERRED EMBODIMENT

Figure 1:
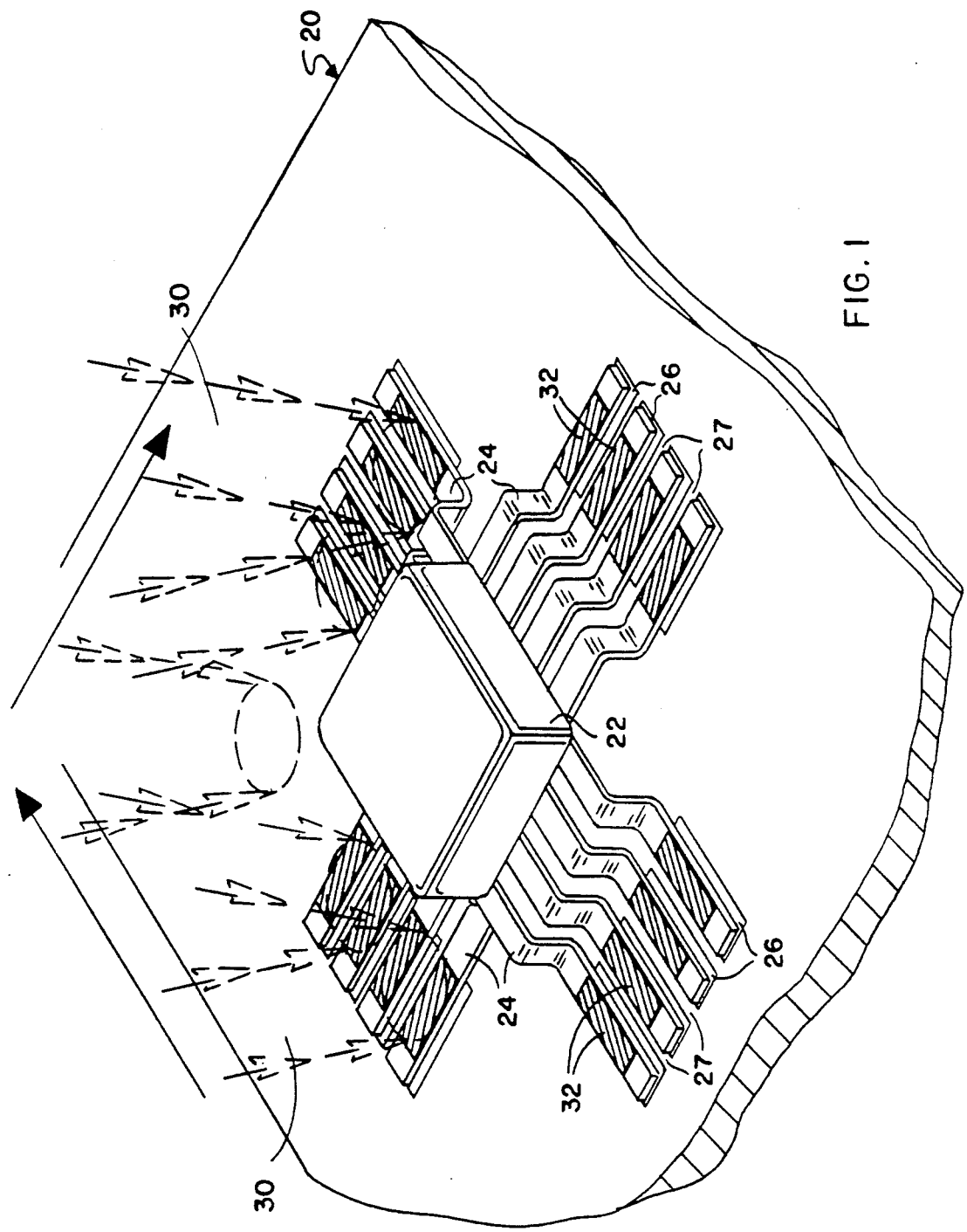
FIG. 1 is an oblique view of the general environment in which an embodiment of the present invention is applied, showing the leads of an integrated circuit component, which are coated with a coating material, being laser bonded to a printed circuit board.

FIG. 1 provides an illustration of the general environment in which an embodiment of the present invention may be practiced. FIG. 1 includes an oblique, sectioned view of a printed circuit board 20 on which an integrated circuit component 22 is to be mounted. More particularly, through a laser bonding process the individual leads 24 of component 22 are to be bonded to contact pads 26. Although not detailed in any of the drawings, contact pads 26 are electrically connected to the circuitry of board 20, and they establish the conductive paths by which leads 24 of component 22 are connected with the other electrical componentry on board 20.

FIG. 1 also shows laser beam 30, which is produced by an Nd:YAG laser (not shown) and has a wavelength of 1.064 micrometers, directed at the lead/pad combinations. Beam 30 is used to heat the lead/pad combinations to a temperature at which solder reflow will occur and a solder joint will be formed between each lead 24 and pad 26. Although in this particular embodiment, laser 30 is an Nd:YAG laser, in other applications of the present invention, a different laser, such as a $CO_2$ laser, could be used.

Additionally, in this particular embodiment beam 30 is shown to continuously sweep around the leads 24 of component 22. Thus, beam 30 will irradiate not only the surfaces of the leads 24, but also as beam 30 sweeps around component 22 it will irradiate the portions of board 20 which are in between leads 24 and pads 26, shown as reference number 27 on FIG. 1.

In the embodiment shown in FIG. 1, leads 24 of component 22 are made up of a material which is highly reflective of the wavelength of beam 30. In particular applications, leads 24 may be comprised of copper or may have a gold coating, both being highly reflective of beam 30. If the lead/pad combinations were to be bonded using an approach in which the uncoated surface of the lead is irradiated by the laser, it would take a considerable amount of time for solder reflow to occur because of the lead reflectivity. Additionally, with the laser beam directed at the lead for an appreciable period of time, there is a greater likelihood that the beam may damage the lead, the component, or the printed circuit board by burning it or heating it to the point of pad delamination.

Still referring to FIG. 1, and in accordance with the present invention, in order to make the otherwise reflective surfaces of leads 24 less reflective of the energy of beam 30, each lead 24 is coated with coating material 32. As will be detailed below, it is preferable to coat only that portion of lead 24 that is to be exposed to beam 30. This is to insure that coating material 32 does not get in between lead 24 and pad 26, given that the introduction of a foreign material between lead 24 and pad 26 may increase the likelihood that a weak joint will be formed.

Coating material 32 is absorptive of the wavelength of beam 30, such that with beam 30 directed at the coated surface of lead 24, lead 24 will absorb laser energy and rapidly heat to the point of solder reflow.

Thereafter, when lead 24 cools, it will harden to form a joint between lead 24 and pad 26. Table A includes a number of suitable, commercially available, and inexpensive materials that can be used as coating material 32. Table A further includes the average thickness of the coating, taken from a number of samples, as well as the total reflectivity of the coating as measured in an integrating sphere at 1.064 micrometers, with the specimens tested at room temperature (25° C.) and at low photon fluence (e.g. quartz-halogen lamp). Total reflectivity is equal to the sum of the diffuse (scattered) reflectivity and the specular reflectivity, with a reflectivity of 1.00 representing the value of an object which is 100% reflective. By way of comparison to the reflectivity values shown in Table A, rough copper has a reflectivity measurement of approximately 0.99, as measured in the above reference integrating sphere.

TABLE A

| COATING MATERIAL | AVERAGE THICKNESS (micro inches) | REFLECTIVITY (at 1.064 micrometers, and 1 = 100% reflectivity) |
|---|---|---|
| Drawing Ink | 39.6 | 0.08 |
| Black Paint | 143.8 | 0.05 |
| Paper Mate Marker | 55.8 | 0.31 |
| Stabilo Marker | 9.3 | 0.93 |
| Transfer Tape | 1000 | 0.07 |
| Carbon Deposit | 200 | 0.02 |

The drawing ink used as coating material 32 was sold by Staedtler, Inc. of Germany under the name Marsmatic 745 R. The black paint was sold by Floqui-Polly S Color Corp. of Amsterdam, N.Y., #110010 Engine Black Paint, Railroad Colors. The Paper Mate marker was a permanent black marker sold by the Paper Mate Division of the Gillette Company of Boston, Mass. The Stabilo marker was sold by Schwan-Stabilo, USA of Peachtree City, Ga. The transfer tape was distributed by Demco, Inc. of Madison, Wis. The carbon deposit was a soot taken from a smokey flame.

With respect to the Stabilo marker, a bare copper lead was tested in the integrating sphere and found to have a reflectivity of 0.96. It was then coated with the Stabilo marker and the measured reflectivity was reduced to, 0.93. Although this appears to be a somewhat small reduction in reflectivity, it was nonetheless adequate to cause reflow and joint formation. It was also found after laser irradiation of the copper lead coated with a Stabilo marker that the coating underwent a decomposition. It is believed that this decomposition results in additional absorption or thermal transfer resulting in sufficient heating to cause solder reflow.

Although the exact chemical compositions of the coating materials listed in Table A are not known, due in certain instances to the protection of some materials as trade secrets by the manufacturers, it is believed that they are "non-metallic" compositions, meaning that any metal included in the composition is in an ionic, non-elemental form. Additionally, the composition is a "non-flux", meaning that it does not perform the functions of a flux material. As is known in the solder art, a flux is used to reduce or remove non-wetting oxides from the surfaces of solder and base metals that are to be joined. Additionally, the coating material has the characteristic of being coupled with the wavelength of the laser beam such that each composition absorbs the energy of the laser.

With respect to all of the coatings except the transfer tape and the soot deposit, each appears to be made of an organic or inorganic pigment or dye suspended or dissolved in a solvent, or carbon black suspended in a solvent. With respect to the soot, it is made of carbon, while the material of the transfer tape is believed to be carbon.

After coating material 32 is applied to lead 24 and board 20 is treated with a solder flux, component 22 is mounted on board 20 so that lead 24 is aligned with pad 26, as shown on FIG. 1. The soot, transfer tape, drawing ink and black paint are all non soluble in the flux solution. Therefore, after they are applied, and dry to a stable state in the case of the paint or ink, they can be exposed to flux and will not run between the to-be-bonded surfaces of a given lead/pad combination. Nor will such coating materials run onto board 20 between adjoining lead/pad combinations.

On the other hand, the Paper Mate marker and the Stabilo marker may dissolve or destabilize if contacted by the flux. However, it has been found that both markers can be used as a coating material with satisfactory results if the amount of flux applied to board 20 is in a small enough quantity such that the flux is not drawn onto the coated surface by capillary action.

In order to determine the reliability of the joints, experiments using a pull strength tester were performed. Generally, it was found that better bonding is achieved if only that portion of the component that is impinged by the laser is coated with coating material 32. By ductile failure analysis it was determined that the introduction of the coating material between the surfaces of the conductive elements that are to be bonded has a tendency to inhibit and weaken bond formation.

For example, a joint analysis was made of a gold coated lead which was bonded using the various coatings and a rosin activated (RA) flux, which is the most aggressive class of flux commonly used in the soldering industry. When only the top of the lead 24 was coated with either the Magic Marker or the Stabilo marker there was good wetting by the solder around the lead periphery, as evidenced by the fillet formation. On the other hand, when the top and bottom of lead 24 were coated (the bottom of lead 24 being the portion which contacts the top of the pad 26), there again appeared to be good wetting peripherally. However, through analysis it was found that the interface of the lead 24 and the pad 26 did not demonstrate good ductile fracture characteristics due to the presence of particulates between the lead and pad.

With respect to the paint and drawing ink, the top coating led to good wetting peripherally. When both the top and bottom were coated using either the paint or the drawing ink, both remained at the lead/pad interface and degraded the integrity of the joint. Finally, with respect to the transfer tape, when the top only was coated there was good wetting; however, the coating inhibited the solder from wicking to the top of the lead. When both the top and bottom were coated, poor wetting occurred, as it appears that the transfer tape material prevented wetting.

In accordance with the embodiment of the present invention, there are a number of different techniques by which coating material 32 may be coated onto lead 24. For example, when using the Papermate or Stabilo marker, the application of coating material 32 can be done through a felt tip applicator. Other application processes could use a pressure transfer tape, an ink or die coating deposited through a spray deposit or ink jet system, electro static deposition, or a roller type mechanism.

Although specific coating materials 32 have been identified, other suitable materials may be used provided they are properly coupled with the laser, such that they absorb the laser energy and cause the lead to heat. In addition, coating material 32 should be of the type that quickly dries to a stable state such that it does not run when exposed to a flux, or the quantity of flux is controlled so that it does not contact the coated surface, as discussed above. This is so that coating material 32 remains where it was originally applied and does not run onto other components or board 20, which could result in board burning, or the formation of unintended electrical connections when beam 30 sweeps around component 22. Coating material 32 does not cause any chemical change to the surface on which it is applied, such as by oxidizing it. Finally, when applied in the manner discussed above, coating material does not inhibit the wetting of the solder composition.

Figure 2A:
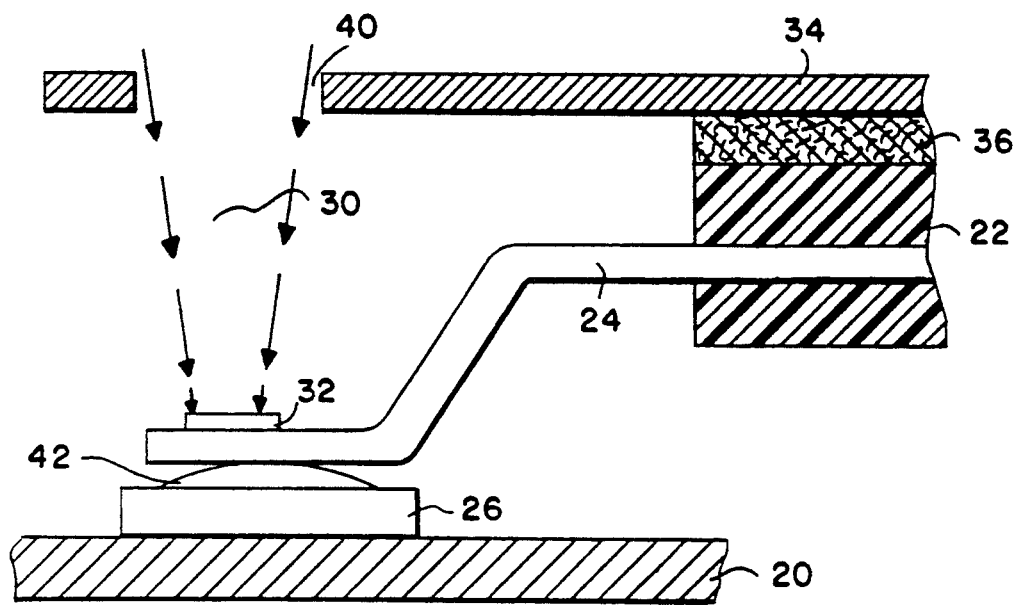
FIG. 2A is a side section view of one lead of the component shown in FIG. 1, the component lead being secured on top of a contact pad during laser bonding by means of a hold-down fixture.

Referring now to FIG. 2A a side section view is provided of a single lead 24 of component 22 mounted on pad 26 of board 20. In addition, FIG. 2A includes a sectioned view of a suitable hold-down fixture 34 for compressing the body of component 22 to insure that lead 24 remains in intimate contact with pad 26 during the bonding operation. The particular hold-down fixture 34 has a silicone member 36, which makes contact with the top surface of component 22, and hold-down fixture 34 has an aperture 40, through which beam 30 is directed at the lead/pad combination. An example of a suitable hold down fixture is found in U.S. Pat. No. 5,175,410, issued Dec. 29, 1992, to Freedman, et. al.

As shown in FIG. 2A, the top surface of lead 24 is coated with coating material 32. In the preferred embodiment, beam 30 is transmitted through aperture 40 and directed at that portion of lead 24 which is coated with coating material 32. As discussed above, coating material 32 is properly coupled with beam 30, such that coating material 32 absorbs the beam energy and thereby causes lead 24 to heat up.

In the side view of FIG. 2A, pad 26 is covered with a so-called "solder dome" 42, which is positioned between the bottom of lead 24 and the top of pad 26. Due to the fact that hold-down fixture 34 holds lead 24 in intimate contact with pad 26, lead 24 and dome 42 are thermally coupled to one another. Therefore, when lead 24 is heated by laser 30, lead 24 conducts heat to dome 42, thereby causing dome 42 to melt. After beam 30 is no longer transmitted to lead 24, the solder will cool and harden forming a joint between lead 24 and pad 26. In other embodiments, pad 26 may be coated with a solder composition instead of having dome 42 formed on its top. Typical solder compositions for dome 42, or a solder coating, are a eutectic, or near eutectic, tin/lead, tin/lead/bismuth, or tin/antimony combination.

In an alternate application of an embodiment of the present invention, it may be desirable to direct beam 30 to contact pad 26, instead of lead 24. In one such application, contact pad 26 is made of, or coated with, a material that is reflective of beam 30, such as copper or gold. As shown in the side sectioned view of FIG. 2B, a portion of the reflective surface of pad 26 is coated with coating material 32. Similar to FIG. 2A component 22 is secured during the bonding operation by hold-down fixture 34, so that lead 24 is held in intimate contact with pad 26.

Figure 2B:
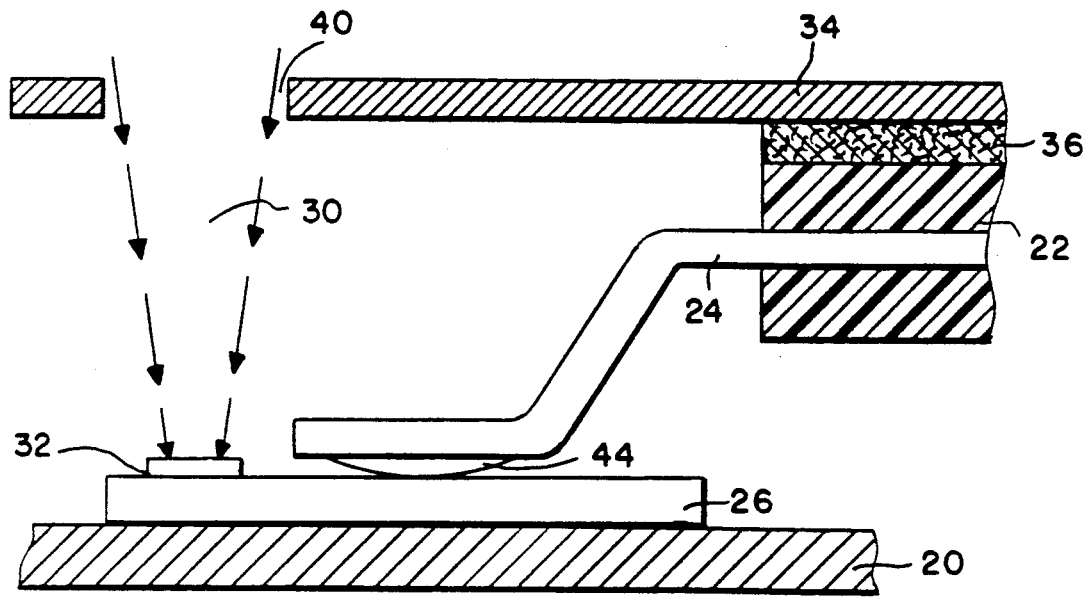
FIG. 2B shows a side sectioned view of one lead of a component secured on top of a contact pad during the laser bonding process by means of a hold-down fixture, the contact pad having a laser absorptive coating material, in accordance with an embodiment of the present invention.

As shown in FIG. 2B, the bottom side of lead 24 is formed with a solder dome 44, which is made of the same material as dome 42, discussed above. As in the example provided in FIG. 2A, the radiant energy of beam 30 is absorbed by coating material 32 causing contact pad 26 to heat. Again, because lead 24 is held in intimate contact with pad 26, the heat of pad 26 is conducted to dome 44, which thereby causes dome 44 to melt. After the solder melts and hardens a joint is formed between pad 26 and lead 24.

Figure 3:
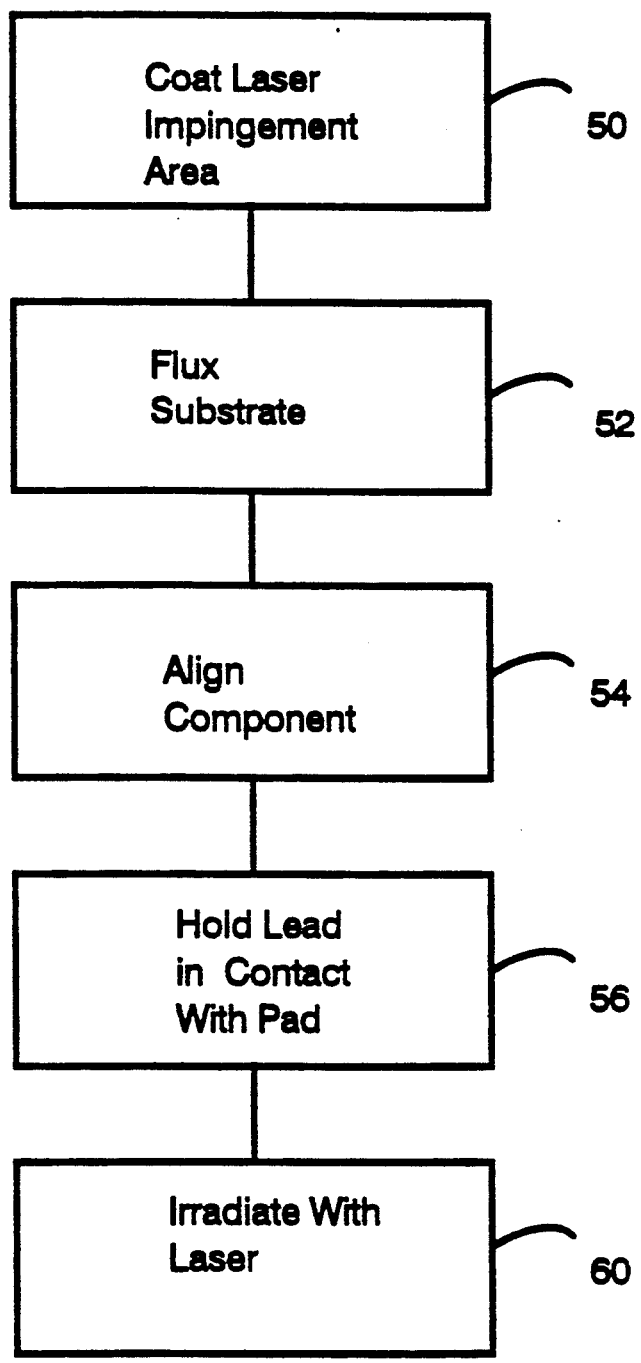
FIG. 3 is a flow diagram showing the process by which an embodiment of the present invention is practiced.

Referring now to FIG. 3, a flow diagram provides an illustration of a process in accordance with an embodiment of the present invention. In step 50 coating material 32 is applied to the area which will be impinged by beam 30. As discussed above, in some applications that area may be the surface of lead 24, shown in FIG. 2A, or it may be a surface of pad 26, shown in FIG. 2B. In the exemplary process shown in FIG. 3, it will be assumed that coating material 32 is applied to the top surfaces of leads 24 as shown in FIGS. 1 and 2B. Coating material 32 either may be dry when it is applied, or it tends to dry rapidly, such that by the time component 22 is mounted on board 20 coating material 32 has dried to a stable state, and does not run to the bottom of the lead.

In step 52, board 20 is treated with a flux which prepares the board and contact pads 26. In step 54 component 22 is mounted on printed circuit board 20. More specifically, the leads 24 of component 22 are aligned with their respective contact pads 26, such that component 22 is positioned in the same general position as shown in FIG. 1. After component 22 is properly mounted and aligned, leads 24 are pressed and maintained in aligned, intimate contact with pads 26 (step 56) by means of hold-down fixture 34, as shown in FIG. 2A.

Finally, in step 60 with leads 24 held in contact with pads 26, beam 30 is directed at the coated surface of each lead 24. In one particular embodiment, beam 30 is made to continuously sweep around the perimeter of component 22 instead of pulsing on and off. The continuous sweep process is easier to implement insofar as it does not require the precise alignment of beam 30 with specific lead/pad combinations.

When beam 30 sweeps around the periphery of component 22 it will impinge the surfaces of leads 24 that have been coated with coating material 32. As discussed above, due to the proper coupling of coating material 32 with the wavelength of beam 30 the energy of beam 30 will be absorbed by lead 24 causing heating, solder reflow, and eventual joint formation between lead 24 and pad 26.

Although the specific embodiments of the present invention have been discussed in connection with a component with leads that are to be bonded to contact pads, rigid leaded components, other embodiments of the invention could be applied to flexible leaded connectors. For example, the conductive portions of flexible connectors, such as those that are affixed to a polyimide tape, as in the Tape Automated Bonding (TAB) environment, could be coated with the coating material to make an otherwise reflective surface of the conductive elements absorptive of the laser beam.

Additionally, in the specific embodiments discussed the laser beam was said to be of the continuous sweep variety; however, the process may also be applied to the formation of joints using pulsed laser bonding. Also the process may be applied when using a laser for welding or brazing. In such applications and consistent with the above detailed descriptions, the reflective surface which is to be irradiated by the laser would be coated with the coating material to make it less reflective of the laser energy.

Accordingly, the invention in its broader aspects is not limited to the specific details, representative apparatus, and illustrative examples shown and described herein. Thus, departures may be made from such details without departing from the spirit or scope of the invention.

What is claimed is:

1. An apparatus comprising:
   a body;
   an electrically conductive element attached to said body, said conductive element having a first percentage of laser beam reflectivity; and
   a non-flux, non-metallic, coating material coating a surface of said conductive element, said material having a second percentage of laser beam reflectivity which is less than the reflectivity of said conductive element.

2. The apparatus as in claim 1, wherein said body includes an integrated circuit chip and said conductive element is a lead.

3. The apparatus as in claim 1, wherein said body is a printed circuit board and said conductive element is a pad.

4. The apparatus as in claim 1, wherein said body includes a tape and said conductive element is a lead.

5. The apparatus as in claim 1, wherein the coating material is more than three percent less reflective than the conductive element.

6. The apparatus as in claim 1, wherein the coating material is stable when exposed to a flux.

7. The apparatus as in claim 1, wherein the coating material is comprised of a pigment in a solvent.

8. The apparatus as in claim 1, wherein the coating material is comprised of a dye in a solvent.

9. The apparatus as in claim 1, wherein the coating material is comprised of carbon.

10. The apparatus as in claim 1, wherein only the surface of the conductive element which is impinged by the laser beam is coated with the coating material.

11. A method of laser bonding comprising the steps of:
    coating a surface of an electrically conductive element, which has a first percentage of laser beam reflectivity, with a non-flux, non-metallic, coating material, which has a second percentage of laser beam reflectivity, the second percentage being less than the first; and
    irradiating the coated surface with the laser beam.

12. The method as in claim 11, wherein the coating material is stable when exposed to a flux.

13. The method as in claim 11, wherein the coating material is comprised of a pigment in a solvent.

14. The method as in claim 11, wherein the coating material is comprised of a dye in a solvent.

15. The method as in claim 11, wherein the coating material is comprised of carbon.

16. The method as in claim 11, wherein only the surface of the element which is impinged by the laser beam is coated with the coating material.

17. The method as in claim 11, wherein the coating material is more than three percent less reflective than the conductive element.

18. The method as in claim 11, wherein said irradiating step is accomplished using a continuous sweep laser.

19. The method as in claim 11, further comprising the step of:
placing the conductive element in contact with a second conductive element before said irradiating step.

20. The method as in claim 19, further comprising the step of:
holding the first conductive element in intimate contact with the second conductive element during said irradiating step.

* * * * *